(12) United States Patent
Batchelder et al.

(10) Patent No.: US 6,544,338 B1
(45) Date of Patent: Apr. 8, 2003

(54) INVERTED HOT PLATE CURE MODULE

(75) Inventors: William Tom Batchelder, Oakland, CA (US); Fred Joseph Chetcuti, Millbrae, CA (US); Lawrence Allen Gochberg, Menlo Park, CA (US)

(73) Assignee: Novellus Systems, Inc., San Jose, CA (US)

( * ) Notice: Subject to any disclaimer, the term of this patent is extended or adjusted under 35 U.S.C. 154(b) by 0 days.

(21) Appl. No.: 09/502,417

(22) Filed: Feb. 10, 2000

(51) Int. Cl.[7] .............................................. B05C 13/02
(52) U.S. Cl. .......................... 118/641; 118/59; 118/66; 118/69; 118/50; 118/724; 118/725; 118/500; 165/80.2; 165/80.3; 165/80.4
(58) Field of Search ............................ 118/641, 59, 66, 118/69, 500, 50, 724, 725; 427/374.1, 398.4, 398.5; 165/80.2–80.4

(56) References Cited

U.S. PATENT DOCUMENTS

| 5,411,076 | A | * | 5/1995 | Matsunaga et al. | ......... 165/80.2 |
| 5,431,700 | A | * | 7/1995 | Sloan | ........................... 165/65 |
| 5,651,823 | A | * | 7/1997 | Parodi et al. | ................. 118/500 |
| 5,884,009 | A | * | 3/1999 | Okase | ......................... 219/405 |
| 6,072,163 | A | * | 6/2000 | Armstrong et al. | ......... 118/724 |

* cited by examiner

Primary Examiner—Laura Edwards

(57) ABSTRACT

A curing module for use in fabricating semiconductor wafers is provided. The cure module comprises a housing and a bottom plate. The housing also contains a heating plate adjacent a top surface of the housing and side walls extending from the top surface. The housing sidewalls, the heating plate and the bottom plate define a chamber within the cure module. Films disposed on semiconductor wafers are cured within the chamber by being raised on lift pins to the heating plate during a heating operation and then lowered on the lift pins to the bottom plate during a cooling operation.

24 Claims, 13 Drawing Sheets

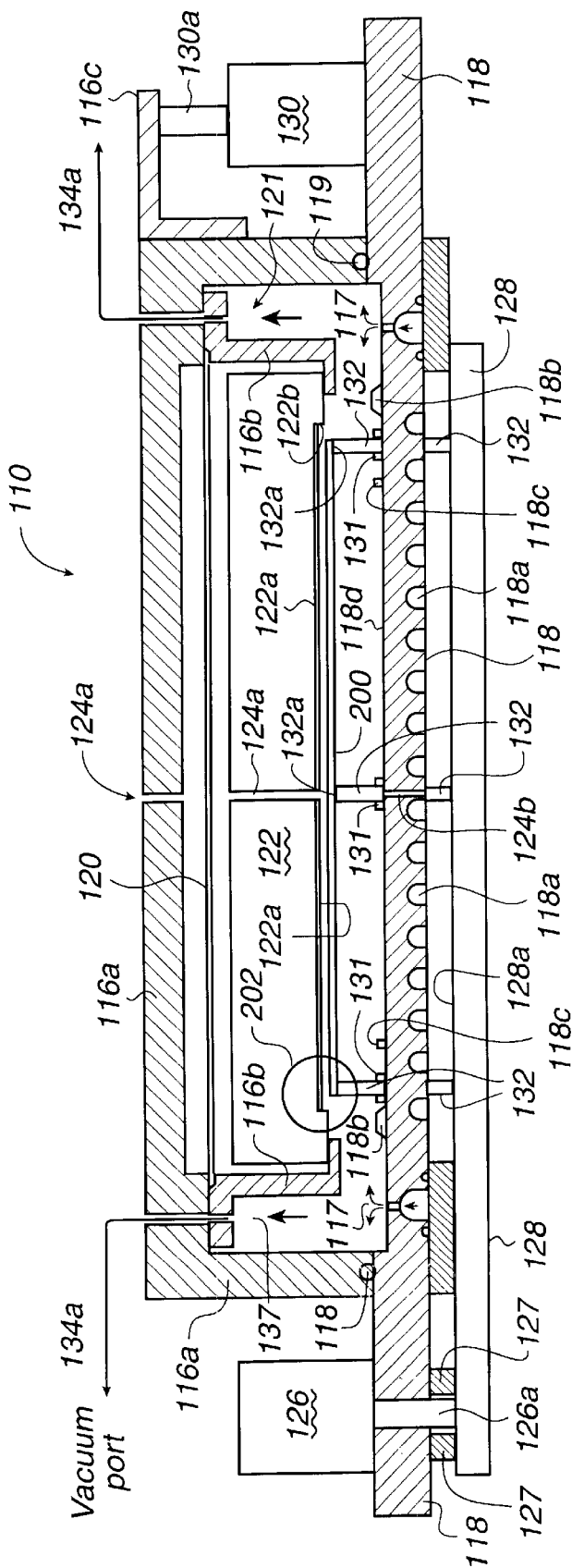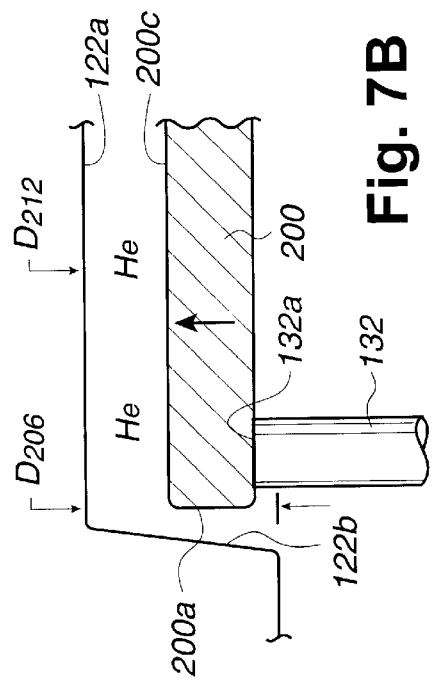
Fig. 7A
Fig. 7B

INVERTED HOT PLATE CURE MODULE

BACKGROUND OF THE INVENTION

1. Field of the Invention

The present invention relates to the heat treatment of semiconductor wafers and more specifically to an apparatus for heat treating of layers formed over semiconductor wafers.

2. Description of the Related Art

Semiconductor devices are used extensively in today's marketplace. In order to meet the increased demand for devices employing semiconductor devices, techniques to fabricate semiconductor devices and apparatus used to fabricate semiconductor devices must increase in efficiency.

Semiconductor devices are formed from silicon wafers containing various circuitry defining the semiconductor device. During the formation of the circuitry on the silicon wafer, the wafers are subjected to various processes to enhance the quality of the layers formed over the wafers. As is well known, layers formed over wafers in the form of thin films must be cured in order to carry out thermolytic reactions and/or remove solvents. Typically, wafers are cured in curing modules. However, current cure modules suffer from non-uniform heating of wafers and thermal leakage within the module. These problems serve to increase the cure time of a wafer and the overall fabrication time for a semiconductor wafer.

FIG. 1 shows a cure module 10 in accordance with the prior art. The cure module 10 shown in FIG. 1 includes a heating plate 12 and a cooling chamber 20. A semiconductor wafer 11 is placed within a chamber 14 of the cure module 10 through a door 24 that is connected to an arm 24a. The semiconductor wafer 11 is set on lift pins 22 at lift points 22a in the cure module 10 as shown. During a heating operation, the wafer 11 is lowered onto heating plate standoffs 21. The heating plate standoffs 21 are integrally formed with the heating plate 12. After the wafer 11 is placed on the heating plate standoffs 21, the wafer 11 will be held in place over the heating plate 12 with alignment pins 19, as shown in FIG. 1.

As can be seen from FIG. 1, the lift pins 22, alignment pins 19 and heating plate standoffs 21 are in thermal contact with both the heating plate 12 and the wafer 11. The lift pins 22 pass through the heating plate 12 and the alignment pins 19 and heating plate standoffs 21 are in thermal contact with the heating plate 12. Thus, the temperature uniformity of the heating plate 12 will be reduced due to thermal losses from the lift pins 22, alignment pins 19 and heating plate standoffs 21.

The temperature losses in the hot plate due to the alignment pins 19, the lift pins 22 and the heating plate standoffs 21 will cause thermal discontinuities in the wafer 11 as shown by the contact regions 13 in FIG. 1. The thermal discontinuities at the contact regions 13 occur where the wafer is in thermal contact with the alignment pins 19, heating plate standoffs 21 and the lift pins 22. Thus, the non-contact regions 15 are at a lower temperature than the contact regions 13. The thermal discontinuities and the resulting non-uniform heat treatment of the wafer 11 depicted by the non-contact regions 15 and the contact regions 13 will cause undesirable changes in the film properties on the surface of the wafer which may potentially affect the performance of a semiconductor device formed from the wafer.

After the wafer 11 is heated, the wafer 11 must be cooled so that organic components of the film will not oxidize on the surface of the wafer 11 after the wafer 11 is removed from the chamber 14 and exposed to air. The wafer 11 is cooled by first raising it on the lift pins 22 from the heating plate 12 towards a diffusion plate 18. The diffusion plate 18 acts as a shower head for the cooling medium of the cure module 10. The wafer 11 is commonly cooled with a water cooled ($H_2O$) nitrogen gas ($N_2$) flowing through the cooling chamber 20. The nitrogen gas is dispensed through the diffusion plate 18 onto the wafer 11. While the wafer 11 is being heated, heat will rise from the heating plate 12 to the diffusion plate 18, increasing the surface temperature of the diffusion plate 18. The increased temperature of the diffusion plate 18 raises the temperature of the nitrogen gas as it exits through the diffusion plate 18. The higher temperature of the nitrogen gas increases the cooling time of the wafer 11, thereby decreasing the overall efficiency of the curing process.

The diffusion plate 18 also affects the flow rate of the nitrogen gas into the cure module 10. The diffusion plate 18 may contain particles (i.e., due to particle condensation from volatile organic material leaving the wafer surface during the bake process) which may become dislodged during the nitrogen cooling operation. Thus, in order to prevent the dislodging of particles, the nitrogen gas must be passed at a slower rate, thereby decreasing the cooling rate of the wafer 11 and the overall efficiency of the cure module 10.

The seals 23 also make it difficult to maintain a low oxygen environment at high temperatures within the cure module and make vacuum baking impossible. A low oxygen environment is desirable to eliminate the possibility of film oxidation within the chamber 14 during the curing process. Further, during heating the seals 23 necessarily increase in temperature along with the lift pins 22. As can be appreciated, when the seals 23 are constantly exposed to high temperatures, their sealing capabilities are decreased and their useable lifetime is reduced. Therefore, this increases the possibility of oxygen entering the chamber 14 while the wafer is being cured, along with the possibility of oxidation of the film on the wafer and the generation of particulates by the aging seals.

Wafers are loaded into the cure module 10 through a door mechanism 24. The door mechanism 24 is pivoted into place against the cure module 10 with a door mechanism arm 24a. As the door mechanism arm 24a pivots the door mechanism 24 into place against the cure module 10, both the door mechanism 24 and door mechanism arm 24a release particulates outside the chamber. These particulates may fall onto wafers as they are being moved into other processing chambers (not shown) and into the cure module 10. These particulates are a possible cause of defects in a semiconductor device eventually formed with the wafer.

Lift pin through holes 25 also cause thermal discontinuities on the wafer 11. The lift pin through holes 25 represent voids in the heating plate 12, or areas where there is no source of heat emanating from the heating plate 12. These voids cause uneven heating of the wafer 11, which will result in thermal discontinuities.

In view of the foregoing, there is a need for a cure module which is configured to efficiently cure films formed over silicon wafers. There is also a need for modules that can cure formed films in a uniform manner and that avoid the introduction of thermal discontinuities that can affect the performance of the cured films, such as, spin-on glass (SOG), dielectrics including low-K dielectrics, and any other type of applied film.

SUMMARY OF THE INVENTION

Broadly speaking, the present invention fills these needs by providing a curing module with an inverted hot plate. It should be appreciated that the present invention can be implemented in numerous ways, including as a process, an apparatus, a system, a device, or a method. Several inventive embodiments of the present invention are described below.

In one embodiment, a curing module for use in fabricating semiconductor wafers is disclosed. The cure module comprises a chamber having a bottom plate and a housing. The housing has a top surface and sidewalls that are configured to engage with the bottom plate. The top surface, sidewalls and the bottom plate define the chamber. The cure module also has a heating plate within the chamber and that is adjacent to the top surface of the housing.

In another embodiment, a method for making a cure module is disclosed. A housing is generated having a top surface and sidewalls. A bottom plate that is configured to engage with the sidewalls of the housing to create a chamber is then generated. After the bottom plate is generated, a heating plate is attached to the top surface of the housing within the chamber.

In yet another embodiment, a module for curing films on a semiconductor wafer is disclosed. In this embodiment, the module comprises a bottom plate and a heating plate which is located above the bottom plate.

In another embodiment an apparatus for curing wafers is disclosed. The apparatus comprises a cooling bottom plate having cooling fins located on the cooling bottom plate. The cooling fins cool the bottom plate such that the bottom cooling plate cools the wafer during a curing operation. The cure module also has a housing which sealingly engages with the cooling bottom plate and a heating plate located inside the housing. The heating plate is above the cooling bottom plate and the heating plate heats films on semiconductor wafers during a curing operation.

The many advantages of the present invention should be recognized. A cure module can now cure films on semiconductor wafers without introducing thermal discontinuities. The location of the heating plate above the cooling plate allows components necessary for the operation of the cure module, (e.g. lift pins and alignment pins) to be located in the bottom cooling plate portion of the cure module. Therefore, as these components are in contact with wafers, they will not introduce hot spots which cause thermal discontinuities. Also, the heating plate has a uniform surface due to the lack of lift pin through holes, which allows for uniform heating of a wafer.

The chamber for the present invention comprises the heating plate and the cooling plate. All other major components (e.g. O-rings, housing and lift pin positioners) are located outside of the chamber. As a result, these components are not subjected to the temperature fluctuations occurring inside the chamber, (i.e., heating and cooling operations) which decrease the life span and reliability of these components. Hence, the cure module is more cost efficient in that the components last much longer and do not necessitate replacement as often as components in prior art cure modules. In addition, no cooling water is needed.

The present invention has the added advantage of having the heating operation being done from above. This decreases both the cure times and the overall costs of curing films on wafers. Heat from the heating plate will not convect upward to warm the cooling plate, thus, the cooling plate will remain at a reduced temperature and films being cooled by the plate without the use of cooling water (as in the prior art) which greatly simplifies module design and maintenance.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings. Therefore, like reference numerals designate like structural elements.

FIG. 7A shows a heating operation within the cure module in accordance with one embodiment of the current invention.

FIG. 7B is a magnification of FIG. 7A of a cure module in accordance with one embodiment of the present invention.

DETAILED DESCRIPTION OF THE PREFERRED EMBODIMENTS

A cure module with an inverted hot plate and cooling plate is disclosed. In the following description, numerous specific details are set forth in order to provide a thorough understanding of the present invention. It will be understood, however, to one skilled in the art, that the present invention may be practiced without some or all of these specific details. In other instances, well known process operations have not been described in detail in order not to unnecessarily obscure the present invention.

Cure modules are used to cure films on silicon wafers that have been disposed (i.e., using any application technique) on a wafer during a coating process. The coating process for the present invention will be more fully discussed below. In most commonly used low-K dielectrics, the curing process anneals the film to form cross-linked polymer chains or to remove unwanted organic materials from the film. The cross-linked polymer chains strengthen the film on the wafer and decrease the brittleness of the film. The curing further uses the annealing process to remove any unwanted organic materials that will leave behind pores in the film, thereby reducing the dielectric constant of the film. The unwanted by-products may potentially have detrimental effects to the performance of a semiconductor device made from the silicon wafer.

An example of a film that is coated onto a silicon wafer is methylsilsesquioxane (MSQ), which is used in combination with a solvent and a pore creating organic compound, and applied using spin-on glass (SOG) techniques. MSQ is a silicon dioxide-type film having dielectric K values on the order of 2.7–3.1. MSQ also provides good levels of gap fill and planarization. As is well known, good gap fill is desired in order to avoid the formation of voids between metallization lines and to facilitate planarization of the surface of the wafer.

The curing module achieves the annealing operation by implementing a heating plate that is operated at elevated temperatures up to 425° C. However, it should be noted that this invention is not limited to spun on dielectrics, and the cure module can also be used for photoresist bake where lower temperature solvent removal or low temperature chemical reaction is desired to stabilize the film after development of the photoresist. The cure module may also be used over a range of temperatures, limited only to the specific parameters of the film itself. For example, a spun film over a wafer being prepared for electrolytic deposition of copper (Cu) may be heated to 400° C.–425° C., since higher temperatures may change the electrical properties of previous layers deposited on the wafer. Whereas the temperature required for a photoresist bake may be held to operation temperatures in range of about 100° C. to about 150° C.

Figure 1:
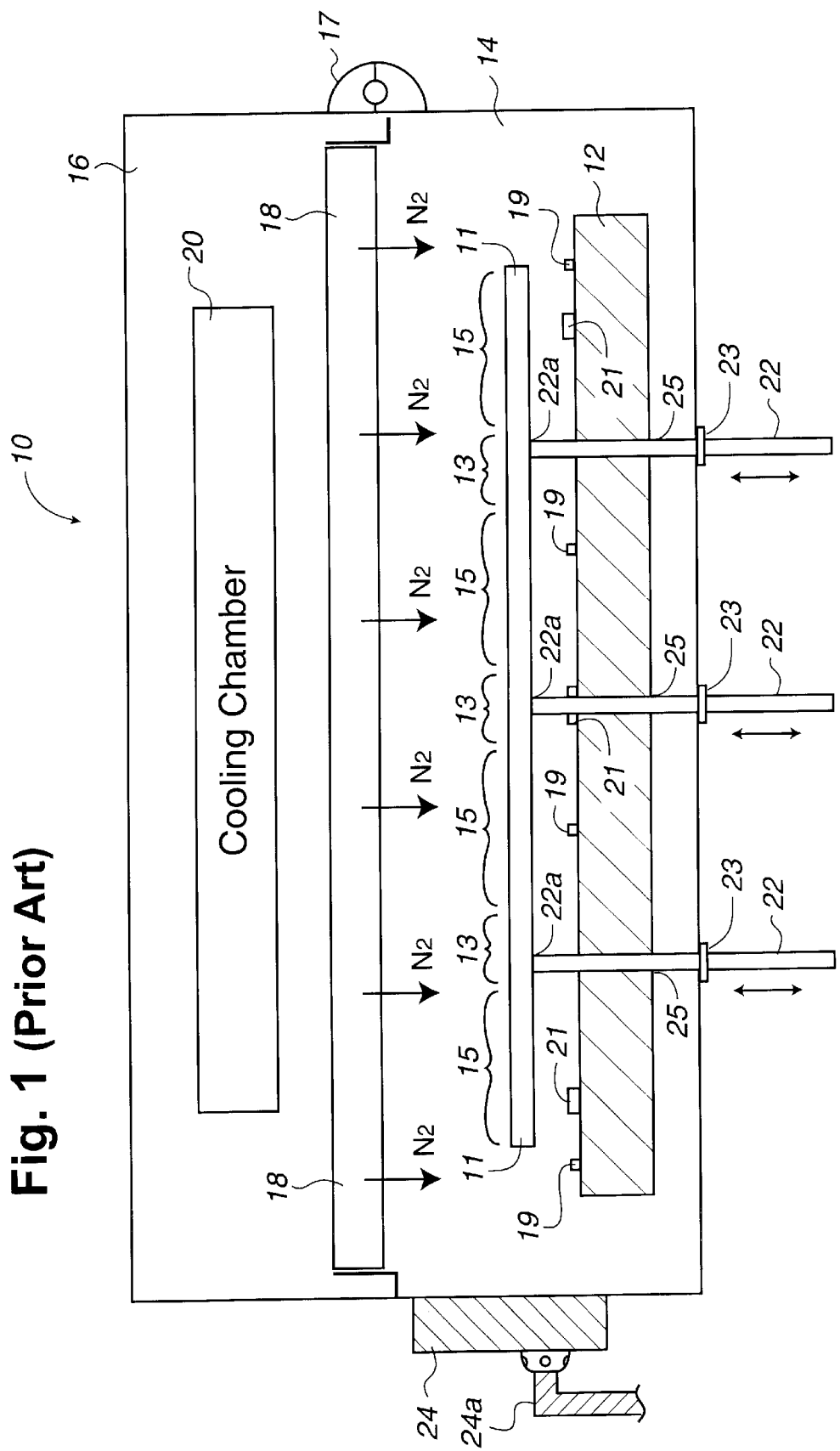
FIG. 1 shows a cure module in accordance with the prior art.
Figure 2A:
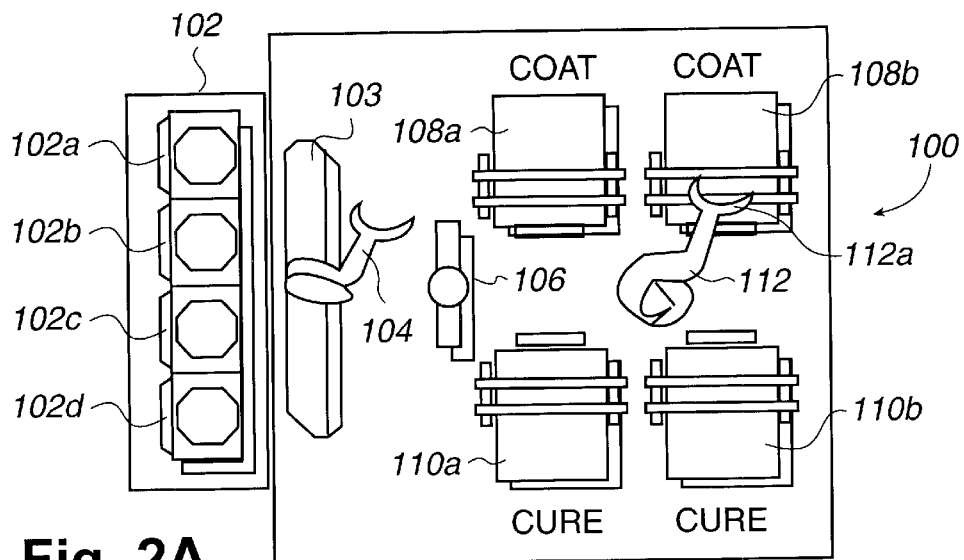
FIG. 2A shows a high-level diagram of a cluster architecture having two cure modules, in accordance with one embodiment of the present invention.

With this in mind, FIG. 2A shows a high-level diagram of a cluster architecture 100 having cure modules 110, in accordance with one embodiment of the present invention. As shown, the cluster architecture 100 includes several modules such as coating modules 108a and 108b, as well as cure modules 110a and 110b. The modules 108 and 110 are serviced by a robot 112. Contained as part of the cluster architecture 100 is a track 103 which supports a robot 104. The robot 104 is configured to access cassettes 102a through 102d that are part of a load and unload station 102. As an overview, the load and unload station 102 can hold numerous wafers in each of the cassettes 102a through 102d, and the robot 104 can move to a selected cassette 102 to retrieve a desired wafer for processing within the cluster architecture 100.

Once the robot 104 has obtained the desired wafer from a cassette 102, the robot 104 places the wafer on a holding station 106. The holding station 106 will preferably hold a wafer for a period of time to allow the robot 112 to properly access the wafer. Once the robot 112 has accessed the wafer from the holding station 106, the robot 112 can place the wafer in a selected coating module 108a or 108b. By way of example, the coating module may be a module that is designed to coat a wafer with a particular film that defines a layer. The film may be a photoresist layer, or a spin-on glass (SOG) layer, an inorganic dielectric layer, an organic dielectric layer, and other low-K dielectric layers.

As is well known, dielectric materials are used in integrated circuit devices to isolate various metallization layers and interconnect lines which are used to form metal interconnect structures implemented to carry out a particular integrated circuit design. The metallization layers can be aluminum containing some copper or can be primarily copper. Copper metallization is becoming more widely used due to lower resistance and its resulting ability to produce faster devices. However, copper metallization is formed into the dielectric material itself using damascene and dual-damascene deposition techniques, and therefore, the performance of dielectrics is constantly being examined. The cure module of the present invention is configured to significantly improve the performance of dielectric curing operations which will in turn improve device performance.

Continuing now with the overview process, after the coating is complete inside one of the coating modules 108a or 108b, the robot 112 will access the particular wafer from the coating module and transfer that wafer to a desired cure module 110a or 110b. In one embodiment of the present invention, as will be shown with reference to FIG. 2C, the cure module 110a or 110b may be in the form of a stacked arrangement such that each cure module shown in FIGS. 2A and 2B may actually be defined by several stacked cure modules. Each of the stacked cure modules will function independently of the other and will allow for higher throughput within the cluster architecture 100. The stackability of the cure modules 110a and 110b will be discussed in greater detail with reference to FIG. 2C.

Figure 2B:
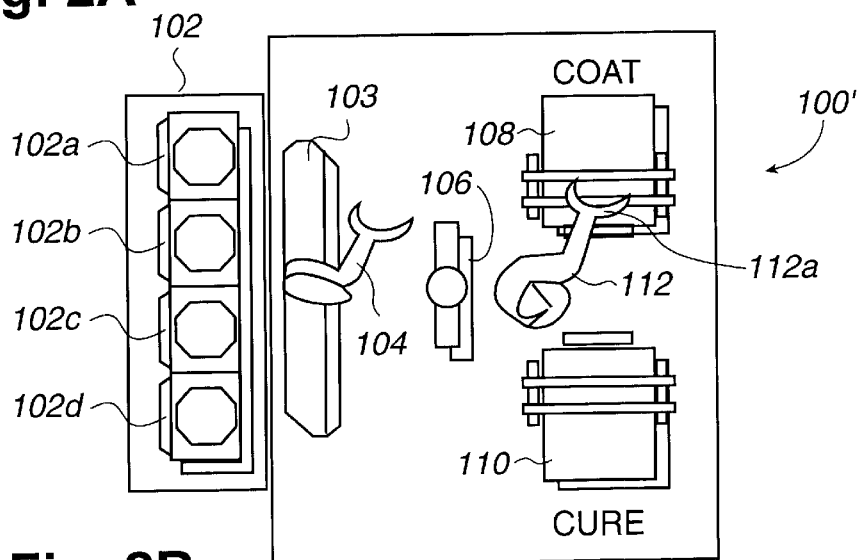
FIG. 2B shows an alternative embodiment of a cluster architecture having one cure module.

FIG. 2B shows an alternative embodiment of a cluster architecture 100' having a cure module 110. In this example, the cluster architecture will only include a single coating module 108 and a single cure module 110. However, the cure module 110 may be a stacked cure module that is defined by multiple independently operated cure modules. As with regard to the embodiment of FIG. 2A, the cluster architecture 100' also preferably includes a robot 112, a holding station 106, a robot 104, and a track 103. The robot 104 is also capable of interfacing with a load and unload station 102 having a plurality of cassettes 102a through 102d. It should be understood that the cluster architectures 100 and 100' are only exemplary by nature and may be modified to include more or fewer modules or components therein. By way of example, the load and unload station 102 may be defined by fewer or more cassettes 102, and some alternative cluster architectures 100 will include other wafer handling mechanisms to eliminate the use of two robots 112 and 104. Thus, a cluster architecture may be defined by a system having only one robot that can feed wafers from a load and unload station 102 directly into a coating module 108 and then into a cure module 110.

Figure 2C:
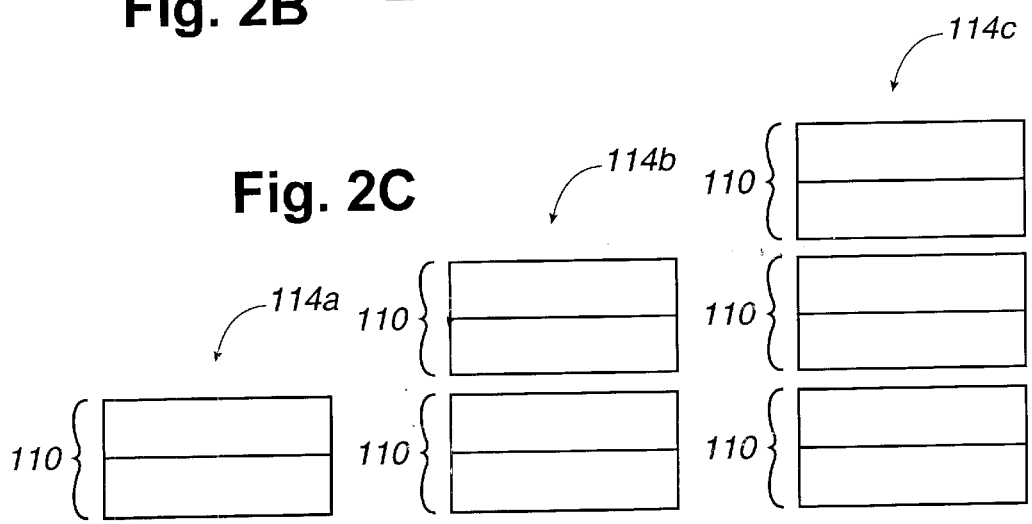
FIG. 2C shows a multiple stack configuration of the cure modules in accordance with one embodiment of the present invention.

FIG. 2C shows a multiple stack configuration of the cure modules 110 in accordance with one embodiment of the present invention. Each cure module 110 is relatively compact in the vertical direction and can be stacked without affecting the operation of each individual cure module 110. A single module configuration 114a shows the cure module 110 without another module stacked thereon. A double module configuration 114b shows one cure module 110 stacked on another cure module 110 to form the double stack configuration. The triple module configuration 114c shows three cure modules 110 stacked on one another to form a triple stack configuration. It should be apparent to those skilled in the art that fewer or more modules may be stacked one on top of the other to form a multiple stack configuration. With reference to FIG. 2A and FIG. 2B, the cure modules 110, 110a and 110b may have a multiple stack configuration, as shown with respect to FIG. 2C. The stacking capability of the cure modules 110 allows the cluster architecture 100 to have increased space efficiency, thus saving in expensive clean room space. Also, the multiple stack configuration increases the curing efficiency of the cluster architecture 100 since more wafers may be processed at the same time.

Figure 3A:
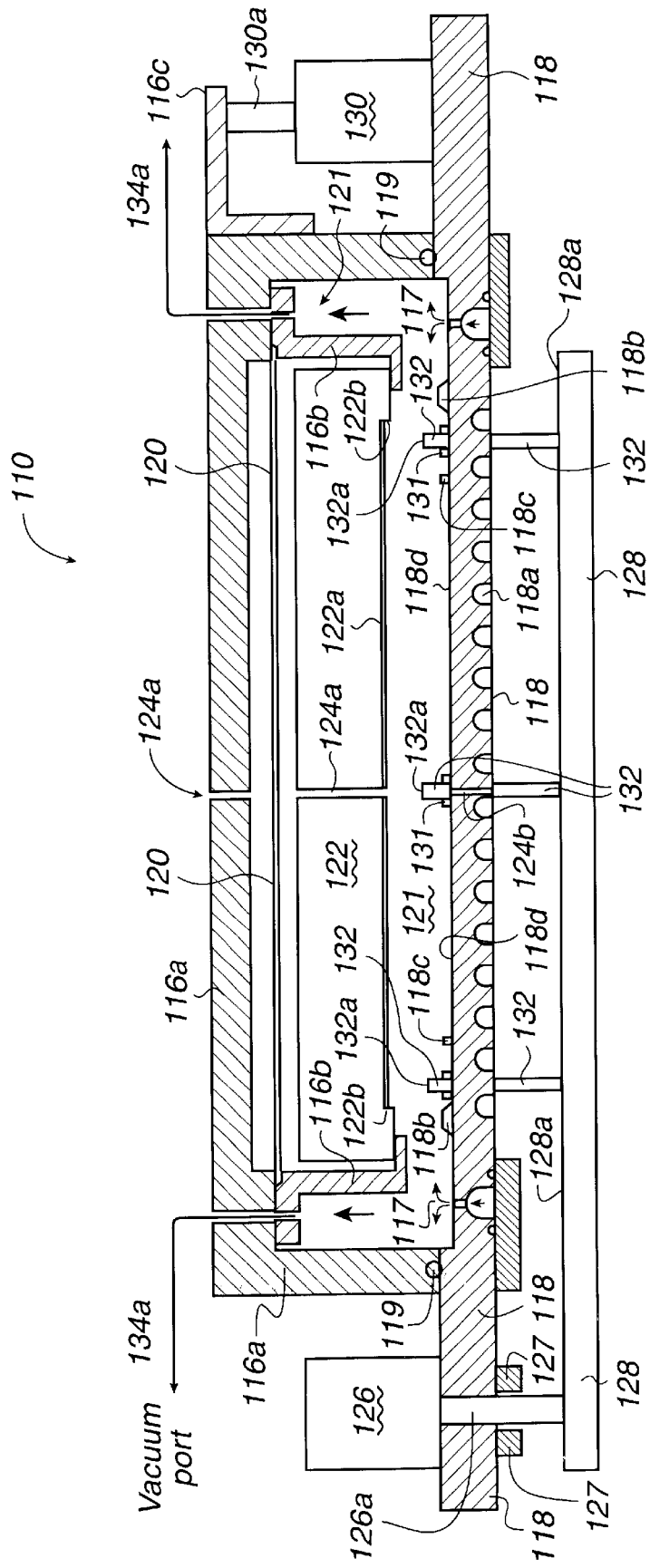
FIG. 3A illustrates a cure module in accordance with one embodiment of the current invention.

FIG. 3A illustrates a cure module 110 in accordance with one embodiment of the current invention. The cure module 110 is defined by a housing 116a and a cooling bottom plate 118. The cooling bottom plate 118 enables the operation of cooling a wafer after the completion of the curing process within the cure module 110. The cooling operation ensures that the wafer will never be exposed while the wafer is at an elevated temperature. The cooling bottom plate 118 cools a bottom region of a chamber 121 which is defined by the cooling surface 118d. The cooling surface 118d can be cooled in any number of ways. For example, the cooling can be facilitated by the use of cooling fins 118a. The cooling fins 118a are configured such that external air, which is at a lower temperature than the cure module 110, flows through the cooling fins 118a. The external air passing through the cooling fins 118a should maintain the bottom cooling plate 118 at a temperature preferably of about 50° C. As cool air passes through the cooling fins 118a, the cooling fins 118a cool the cooling surface 118d through thermal conduction. The lower temperature of the cooling surface 118d will therefore cool a wafer that is placed in close proximity to the cooling surface 118d by convection. In a curing operation, the cooling is generally performed after the wafer has been subjected to a heating operation within the cure module 110.

The cooling bottom plate 118 also includes standoffs 118c. The standoffs 118c hold the wafer (not shown) proximate to the cooling surface 118d. The standoffs 118c may be integrally formed with the cooling bottom plate 118, or the standoffs 118c may be formed or attached on top of the cooling bottom plate 118. As cooling air passes through the cooling fins 118a, the wafer resting on the standoffs 118c will be cooled by convection As will be described below, there are several other ways in which the cooling surface 118d can be cooled.

The cooling bottom plate 118 also includes process gas inlets 117. The process gas inlets 117 allow process gases to flow into the chamber 121 during a curing operation within the cure module 110. The process gases aid in the curing operation within the cure module 110. The process gas inlets 117 are defined by small openings around the periphery of the chamber 121. The gas inlets 117 therefore define a path through the cooling bottom plate 118 and into the chamber 121 of the cure module 110. Therefore, as a wafer is processed in the cure module 110, process gases can be made to flow into the chamber via the process gas inlets 117.

The process gas inlets 117 facilitate the creation of a non-oxidizing environment within the cure module 110 in order to control the cure environment. After a vacuum is created in the chamber 121 through the vacuum ports 134a, process gases are pumped into the cure module 110 via the gas inlets 117. The gases may be pumped at rate in a range that is preferably about 40 liters per minute to about 80 liters per minute. The process gases are configured to increase the cure rate of films on the silicon wafer and prevent the film from becoming hydrophilic. If hydroxyl groups form on the film, the resulting hydrophilic surface will detrimentally increase the dielectric constant of the film upon exposure to air which will decrease the overall performance of the wafer after it has been integrated into a semiconductor chip. In order to prevent the formation of hydroxyl groups, the Oxygen ($O_2$) level within the cure module 110 is preferably controlled. Additionally, other gases may be used which prevent oxidation, for example, a forming gas (e.g., a mixture of nitrogen ($N_2$) and oxygen ($O_2$)).

Still referring to FIG. 3A, the chamber 121 is also defined by the housing 116a. The housing 116a contains a heating plate 122 which heats the topmost portion of the chamber 121 during a curing operation. The heating plate preferably has a thickness in the range of about 1 inch to about 2 inches, more preferably, the heating plate 122 has a thickness of about 1.25 inches. As discussed herein, by having the heating plate 122 on a top region of the cure module 100, it is said that the heating plate 122 is inverted. Thus, the heating plate 122 is supported in the top region of the housing 116a with heating plate brackets 116b. The heating plate brackets 116b may be integrally formed as part of the housing 116a, they may be attached to the housing 116a by way of screws or welds or standoffs on the back of the hot plate.

The heating plate 122 heats a top region of the chamber 121, and the heating plate 122 exposes a hotplate surface 122a over a region where the wafer will subsequently be placed. The heating plate 122 further includes a recess lip 122b formed around the heating plate 122. The recess lip 122b and the hotplate surface 122a form a recess within the heating plate 122. The recess within the heating plate 122 allows a wafer, not shown, to be placed in close proximity to the hotplate surface 122a during a heating operation, as will be discussed later with reference to FIG. 7B. The recess within the hot plate 122 prevents thermal non-uniformities that typically occur in close proximity baking. This problem usually arises from convective cells located at the wafer edge which act to cause temperature variations on the wafer at the wafer edges, thereby decreasing the uniformity of heating across the film of the wafer 200 around the edges.

The housing 116a also contains vacuum ports 134a. The vacuum ports 134a are defined by a number of passageways extending through the housing 116a and around the hot plate 122. The passageway therefore extends from the chamber 121 to an area external to the cure module 110. The vacuum ports 134a allow for the uniform evacuation of air or other gases from the chamber 121 to create a vacuum within the cure module 110. Air flows out of the chamber 121 and through the vacuum ports 134a as shown by the directional arrow. By creating a vacuum in the chamber 121, particulates and other contaminants within the chamber 121 are eliminated, thereby creating a pure atmosphere within the chamber 121. Making reference again to FIG. 3A, the cure module 110 contains an O-ring 119 that allows the formation of a vacuum within the cure module 110. The O-ring 119 resides between the housing 116a and the cooling bottom plate 118 such that when the cooling bottom plate 118 and the housing 116a are in contact with each other, the O-ring 119 engages the housing 116a with the cooling bottom plate 118. Thus, the vacuum created through the vacuum ports 134a is able to be maintained since the O-ring 119 ensures that leakage is eliminated between the housing 116a and the cooling bottom plate 118.

The cure module 110 also includes a radiator shield 120. As shown, the radiator shield 120 is proximate to the heating plate 122. The radiator shield 120 allows as much heat produced by the heating plate 122 to remain within the chamber 121, thereby preventing thermal losses from occurring within the cure module 110. As such, the heating efficiency of the cure module 110 is increased since heating losses are greatly reduced with the radiator shield 120.

The cure module 110 further contains lift pins 132, as shown in FIG. 3A. The lift pins 132 raise and lower a wafer, not shown, in the chamber 121 during a curing process within the cure module 110. The lift pins 132 raise a wafer towards the heating surface 122a during a heating operation and the lift pins 132 lower a wafer towards the cooling bottom plate 118 during a cooling operation. The wafer rests on the lift pins 132 at lift pin contact points 132a.

The lift pins 132 move toward the heating plate 122 and the cooling bottom plate 118 by cantilever 128. The lift pins 132 are proximately located to the cantilever 128 at a surface 128a of the cantilever 128. The cantilever 128 moves in an upward direction and a downward direction, with the cantilever positioner 126. The cantilever positioner 126 may be a linear actuator, a stepper motor, a piston or any other mechanism which effects precise motion. The cantilever 128 is connected to the cantilever positioner 126 with a position extension 126a. The cantilever positioner 126 moves the cantilever 128 in an upward direction by retracting the position extension 126a into the cantilever positioner 126. The cantilever positioner 126 lowers the cantilever 128 by extending the position extension 126a in a downward direction.

The cantilever positioner 126 moves the cantilever 128 in an upward direction until the surface 128a of the cantilever 128 comes into contact with lift pin stops 127. The lift pin stops 127 allow for precise positioning of a wafer resting on the lift pins 132 during a heating operation in the cure module 110. The lift pin stops 127 allow precise positioning by preventing the cantilever 128 from raising a wafer any closer to the heating surface 122a after the cantilever 128 has made contact with the lift pin stops 127. Therefore, the lift pin stops 127 prevent a wafer from coming into contact (or hard contact) with the hotplate surface 122a, thus avoiding damage to the wafer.

The lift pins 132 move through the cooling bottom plate 118 through lift pin seals 131. As will discussed below with reference to FIG. 8B, the lift pins 132 are in contact with the lift pin seals 131. The lift pin seals 131 also maintain the vacuum within the cure module 110.

Still referring to FIG. 3A, the housing 116a also contains a housing flange 116c. The housing flange 116c may be integrally formed as part of the housing 116a or it may be attached by bolts, screws, or by welding to the housing 116a. The housing flange 116c allows the housing 116a to move in an upward and downward direction. The housing 116a moves in an upward and downward direction with a housing positioner 130. The housing positioner 130 may be a linear actuator, a stepper motor, a piston or any other mechanism which effectuates precise, linear motion. The housing positioner 130 moves the housing 116a with a position extension 130a. The position extension 130a connects to the housing flange 116c by any number of well known techniques. As the housing positioner 130 extends the position extension 130a in an upward direction, the position extension 130a pushes up against the housing flange 116c which therefore raises the housing 116a. The housing positioner 130 moves the housing 116a in a downward direction by retracting the position extension 130a into the housing positioner 130. As the housing extension 130a retracts into the housing positioner 130, it pulls the housing flange 116c in a downward direction, which brings the housing 116a into sealing engagement with the cooling bottom plate 118. It should be noted that a second housing positioner 130, position extension 130a and housing flange 116c (not shown) may also be placed on a side opposite the housing positioner 130 shown in FIG. 3A.

Figure 3B:
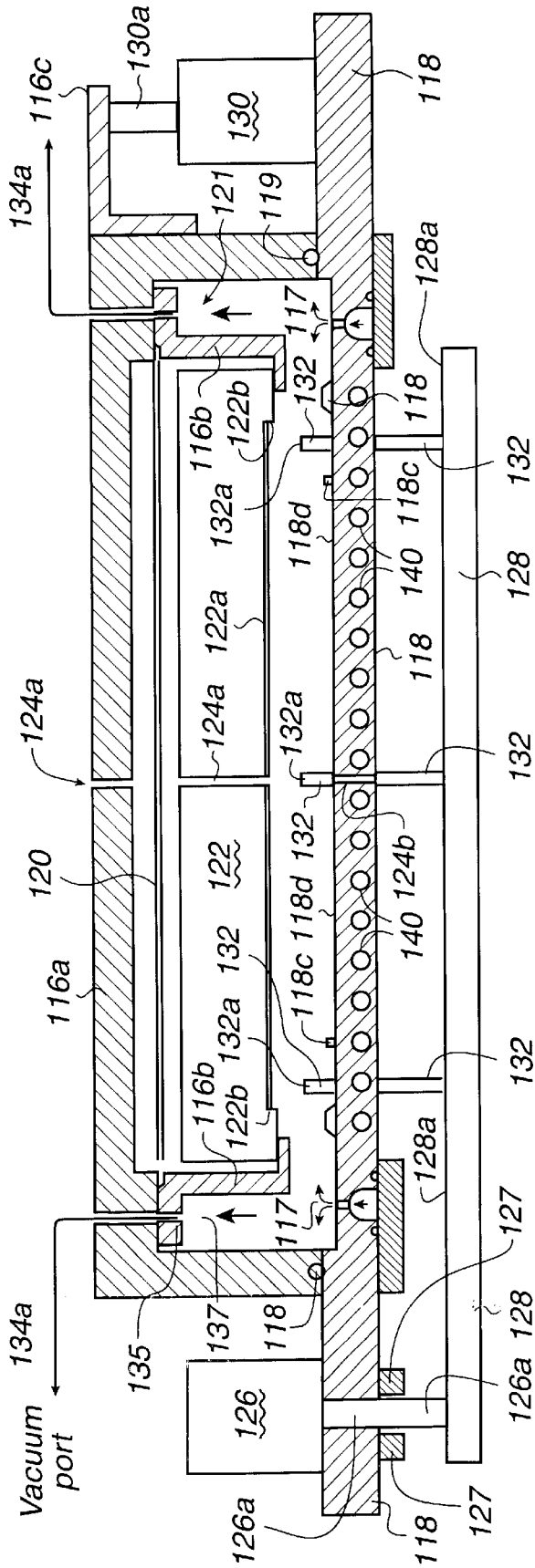
FIG. 3B shows an alternative embodiment of the cure module.

FIG. 3B shows an alternative embodiment of the cure module 110. The cure module 110 in FIG. 3B contains cooling coils 140 which cool the cooling bottom plate 118 during a cooling operation within the cure module 110. The cooling coils allow water, nitrogen, or any other fluid or gas to flow through the bottom plate 118 and therefore cause the cooling. During a cooling operation within the cure module 110, as the wafer is placed proximate to the cooling bottom plate 118, the cooling fluid or gas passes through the cooling coils 140 thereby cooling the cooling bottom plate 118 by conduction, which therefore causes the cooling of a wafer which is placed proximate to the cooling plate 118. In one embodiment, the preferred cooling temperature is between about 25° C. and about 50° C., and most preferably about 50° C. In cases where dielectric films are cured, the cooling should be configured to lower the temperature of the wafer from about 400° C. to about 200° C. to ensure that oxidation does not occur on the film of the silicon wafer 200. It should be noted that the present invention does not cool films disposed on semiconductor wafers by placing a cooling medium directly in contact with either the film or the wafer. As a result, there is no possibility of particulate contamination from the cooling medium.

Figure 4:
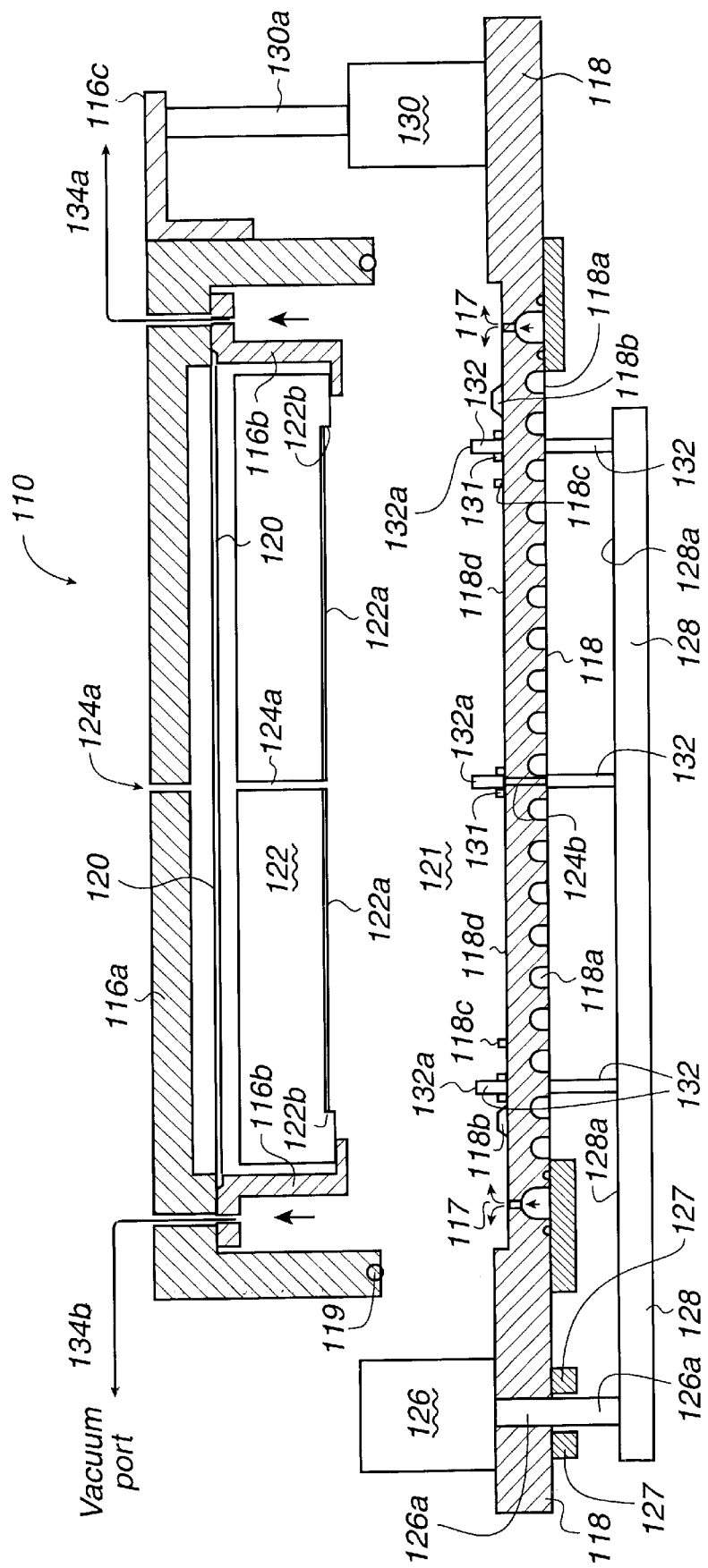
FIG. 4 shows the cure module in an open position in accordance with one embodiment of the present invention.

FIG. 4 shows the cure module 110 in an open position in accordance with one embodiment of the present invention. The cure module 110 is shown in a position ready to receive a wafer. The housing positioner 130 extends the position extension 130a in an upward direction to lift the housing 116a away from the cooling bottom plate 118 as shown. In this orientation, a wafer may now be loaded into the cure module 110 as shown with reference to FIGS. 5 and 6.

Figure 5:
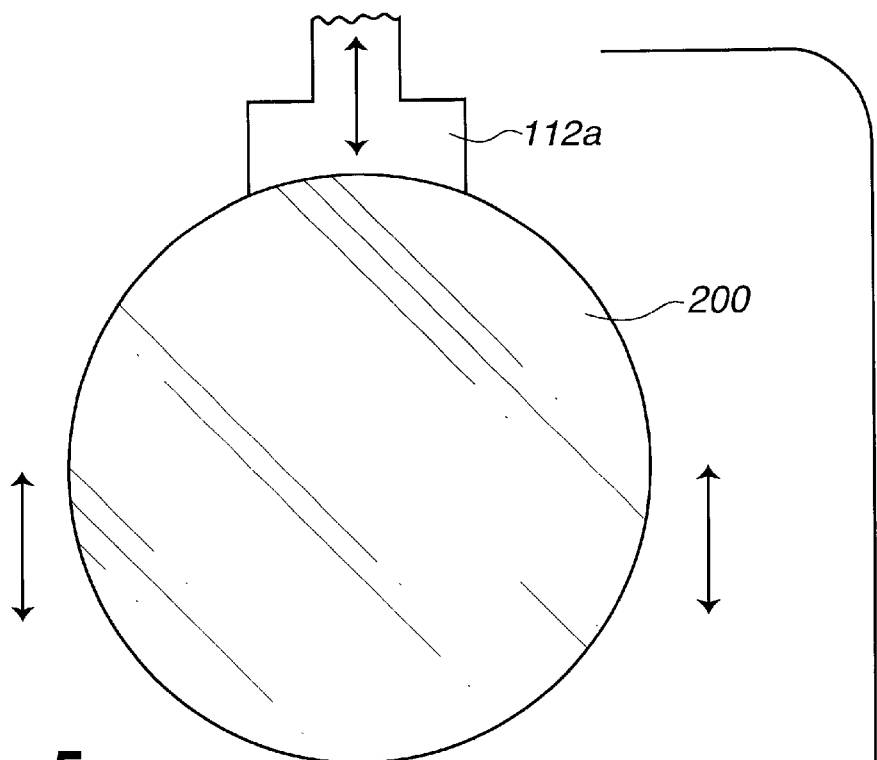
FIG. 5 is a partial top view of the cure module showing a wafer being loaded onto the cooling bottom plate in accordance with one embodiment of the present invention.
Figure 5:
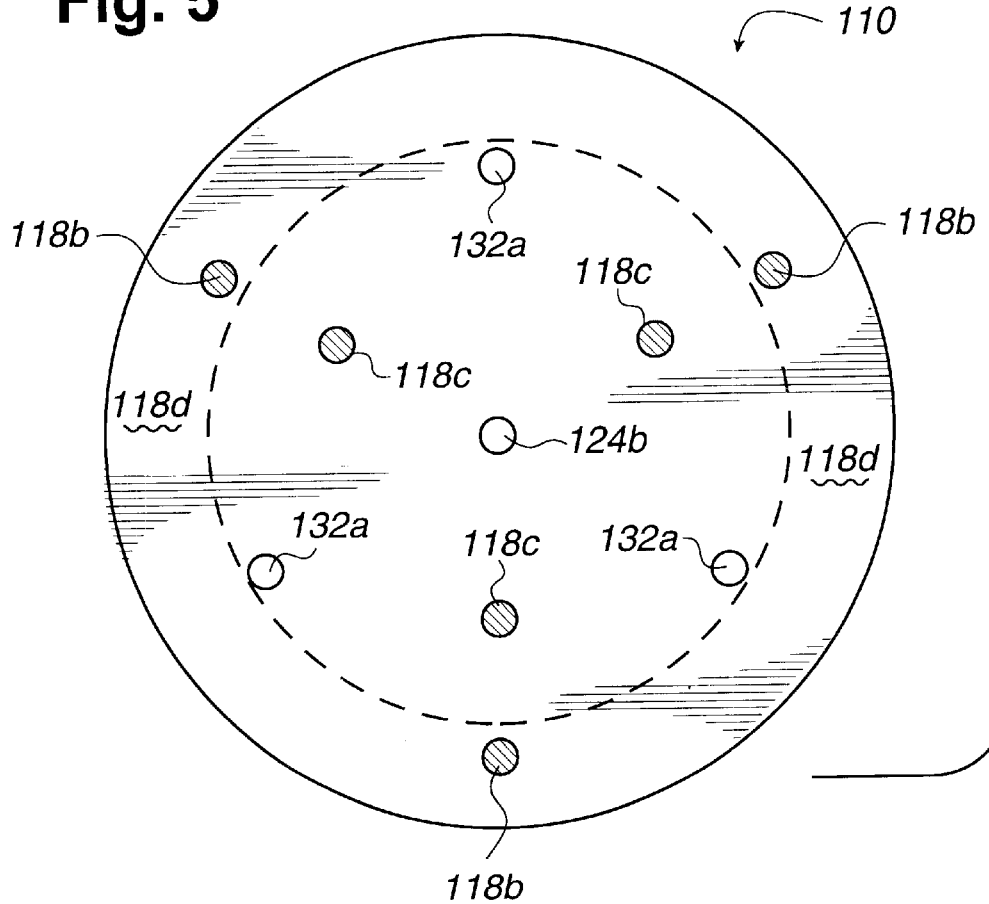

FIG. 5 is a partial top view of the cure module 110 showing a wafer 200 being loaded onto the cooling bottom plate 118 in accordance with one embodiment of the present invention. An end effector 112a of the robot 112 loads the wafer 200 onto the lift pin contact points 132a in the cure module 110. After the end effector 112a loads the wafer 200 onto the lift pin contact points 132a, the end effector 112a retracts from the cure module 110. Also shown are alignment pins 118b, stand-offs 118c and a gas inlet 124b that feeds through the cooling bottom plate 118.

The alignment pins 118b ensure that the wafer 200 is properly aligned with the bottom cooling plate 118 during a cooling operation. In addition, the alignment pins 118b may be used to ensure the wafer 200 is properly aligned with the heating plate 122. By way of example, prior to a heating operation, the wafer 200 may be lowered with the lift pins 132 to the bottom cooling plate 118. With the wafer in this position, the alignment may be checked with the alignment pins 118b. Afterwards, the wafer 200 may be raised toward the heating plate 122 for a heating operation.

Figure 6:
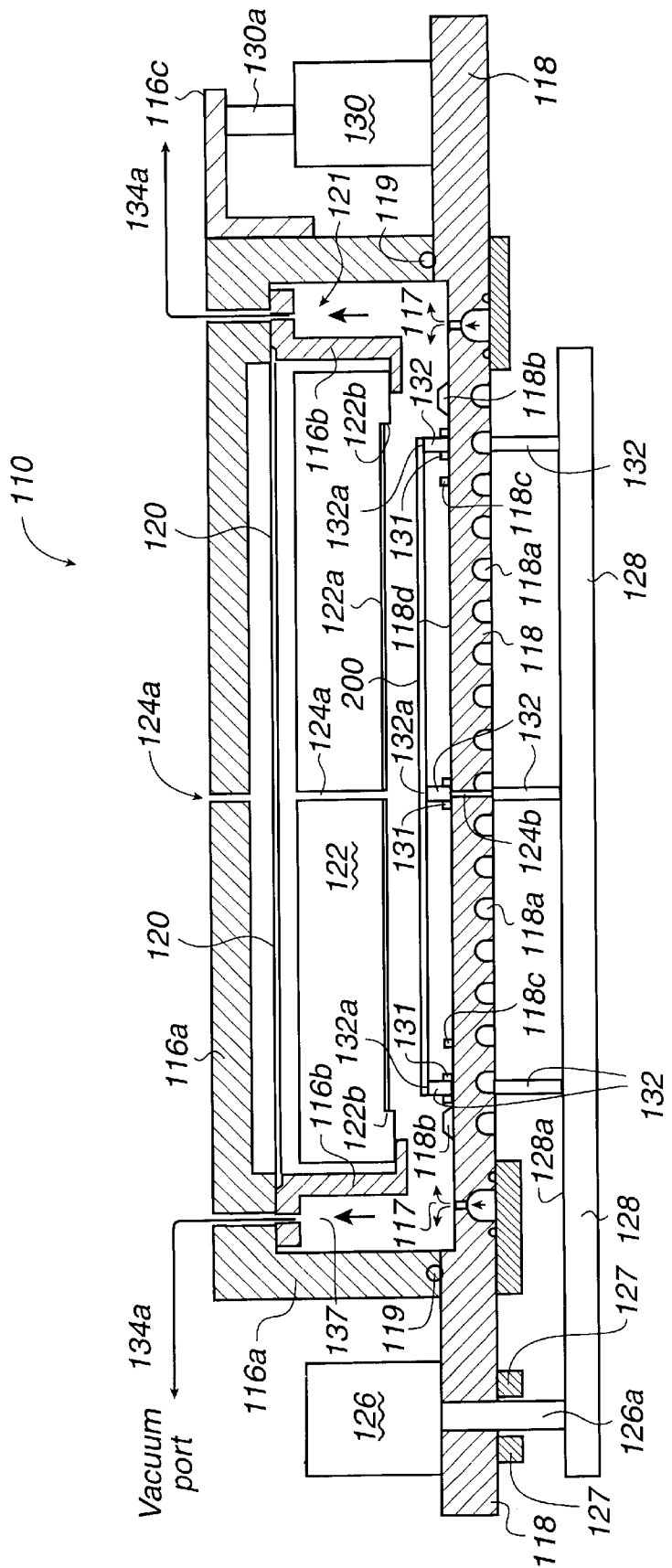
FIG. 6 shows the wafer loaded into the cure module in accordance with an embodiment of the present invention.

FIG. 6 shows the wafer 200 loaded into the cure module 110 in accordance with an embodiment of the present invention. As shown, after the wafer 200 is loaded onto the lift pin contact points 132a, the housing positioner 130 lowers the housing 116a such that the housing 116a is in sealing engagement with the cooling bottom plate 118. The O-ring 119 allows for the formation of a vacuum seal between the housing 116a and the cooling bottom plate 118 such that a vacuum may be formed in the chamber 121. After the cure module 110 is closed, a vacuum is formed inside the cure module 110 by pumping out excess gases and other particulates in the chamber 121 through the vacuum ports 134a. After the vacuum is created in the chamber 121 of the cure module 110, forming gases are pumped into the chamber 121 through the gas inlets 117, as previously discussed with reference to FIG. 3A.

FIG. 7A shows a heating operation within the cure module 110 in accordance with one embodiment of the current invention. After the wafer 200 is loaded into the cure module 110, the lift pins 132 raise the wafer 200 into the recess formed by the recess lip 122b and the hotplate surface 112a. The cantilever positioner 126 pulls the cantilever 128 until the cantilever surface 128a comes into contact with the lift pin stops 127. The lift pin stops 127 are hard stops that prevent the cantilever 128 from moving the lift pins 132 and the wafer 200 into contact with the hot surface 122a. As shown, the lift pin stops 127 allow for precise positioning of the wafer 200 within the recess formed by the recess lip 122b and the hot plate surface 122a. The gas inlet 124a is formed in the heating plate 122 and allows gases to flow into the chamber 121 during the heating operation within the cure module 110 as shown in FIG. 7B. FIG. 7B is a magnification 202 of FIG. 7A of a cure module 110 in accordance with one embodiment of the present invention. As gas flows through the as inlet 124a, it disperses into an area immediately above the wafer 200 defined by the hot plate surface 122a, the recess lip 122b and a top surface 200c of the wafer 200. The presence of the gas within the recess increases the conduction of heat from the heating plate 122 to the wafer 200 during a heating operation, thereby increasing the heating efficiency of films disposed on the wafer and thus increasing the efficiency of the cure module 110. Gases which may flow through the gas inlet 124a include helium (He), $N_2$, a mixture $N_2$ and $O_2$, etc.

As can be seen in FIG. 7B, the wafer 200 is raised by the lift pins 132 until it is preferably located a distance $D_{212}$ from the hotplate surface 122a. Preferably, the distance $D_{212}$ is in a range of about 10 mils to about 30 mils and more preferably about 20 mils. During a heating operation, the hot plate surface 122a heats up and gas from the gas inlet 124a flows into the area between hot plate surface 122a and the wafer surface 200c. The presence of the gas increases the heat transfer rate of the cure module, thereby decreasing the time it takes to cure films (e.g., spin-on dielectrics, deposited layers, etc.) formed on the wafer 200. FIG. 7B also shows the depth $D_{206}$ of the recess formed from the recess slip 122b and the hotplate surface 122a. The depth $D_{206}$ allows the wafer 200 to sit in close proximity to the hot plate surface 122a and at the same time allows room for gas exiting the gas inlet 124a to disperse between the wafer surface 200c and the hot plate surface 122a. Preferably, the depth $D_{206}$ is in a range of about 1 millimeter to about 3 millimeters and more preferably about 2 millimeters.

As seen in FIG. 7B, the recess lip 122b allows heating of the sides of the wafer 200 during the heating operation. By heating the sides of the wafer 200, the heating rate of the wafer is increased, thus increasing the overall efficiency of the cure module 110. The distances $D_{212}$ and $D_{206}$ ensure that the wafer 200 does not come into contact with the heating plate 122. Hence, the distances $D_{212}$ and $D_{206}$ ensure that the film of the silicon wafer 200 is not damaged by the heating plate 122 during a heating operation within the cure module 110.

Figure 8A:
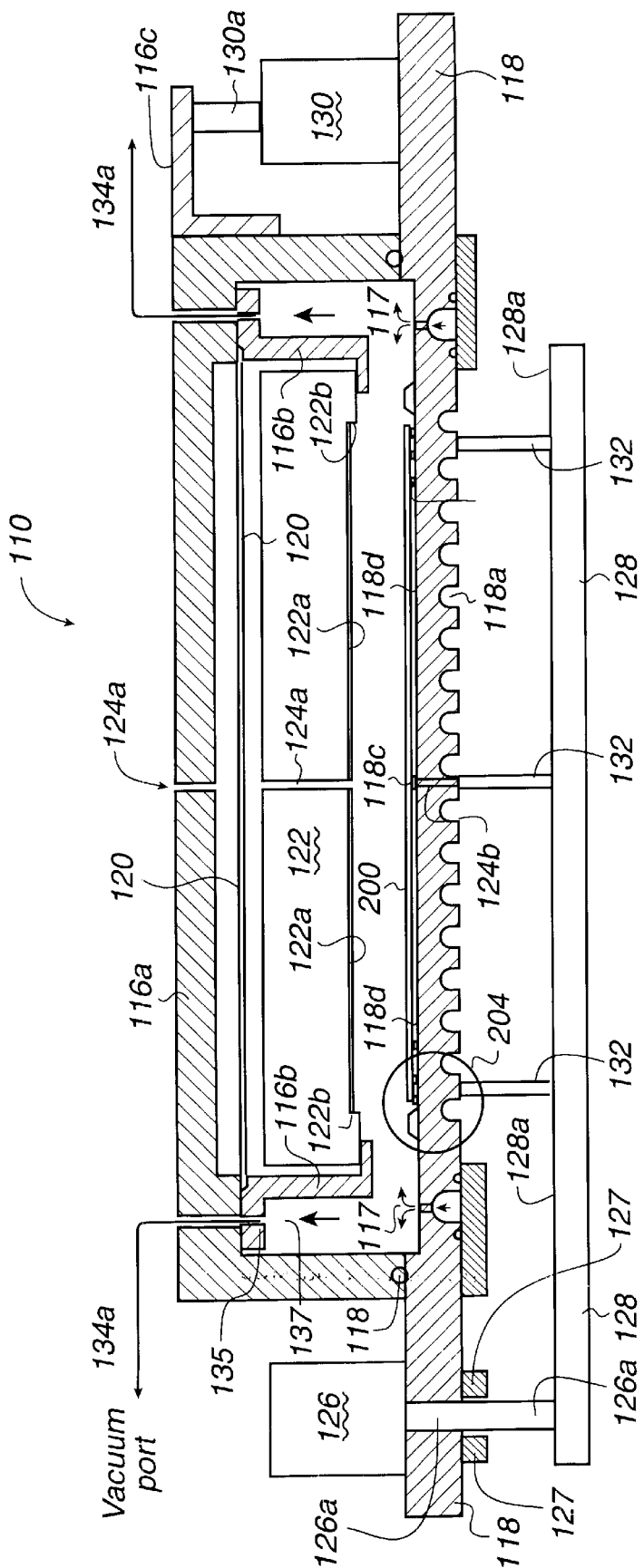
FIG. 8A shows a cooling operation occurring within the cure module in accordance with one embodiment of the current invention.

FIG. 8A shows a cooling operation occurring within the cure module 110 in accordance with one embodiment of the current invention. The wafer 200 is lowered onto the standoffs 118c such that the wafer 200 is in close proximity with the cooling surface 118d. As discussed above, the cooling bottom plate 118 can be cooled by passing cool air through cooling fins 118a, or by cooling coils. Also, cooling of the wafer 200 is further enhanced by gas passing through the gas inlet 124b. The gas inlet 124b allows gases to flow into the chamber 121 during a cooling operation of the wafer 200. As the wafer 200 is lowered onto the standoffs 118c and a cooling operation starts, cooling gas flows through the gas inlet 124b. The gas flowing through the gas inlet 124b enhances the transfer of heat from the wafer to the cooling bottom plate 118. The cooling gas that passes through the gas inlets 124b may be any gas which enhances the conduction of heat from the hot wafer 200 to the cooling bottom plate 118 such as helium (He). As gas passes through the gas inlet 124b, it disperses along the cooling surface 118d as shown with reference to FIG. 8B.

Figure 8B:
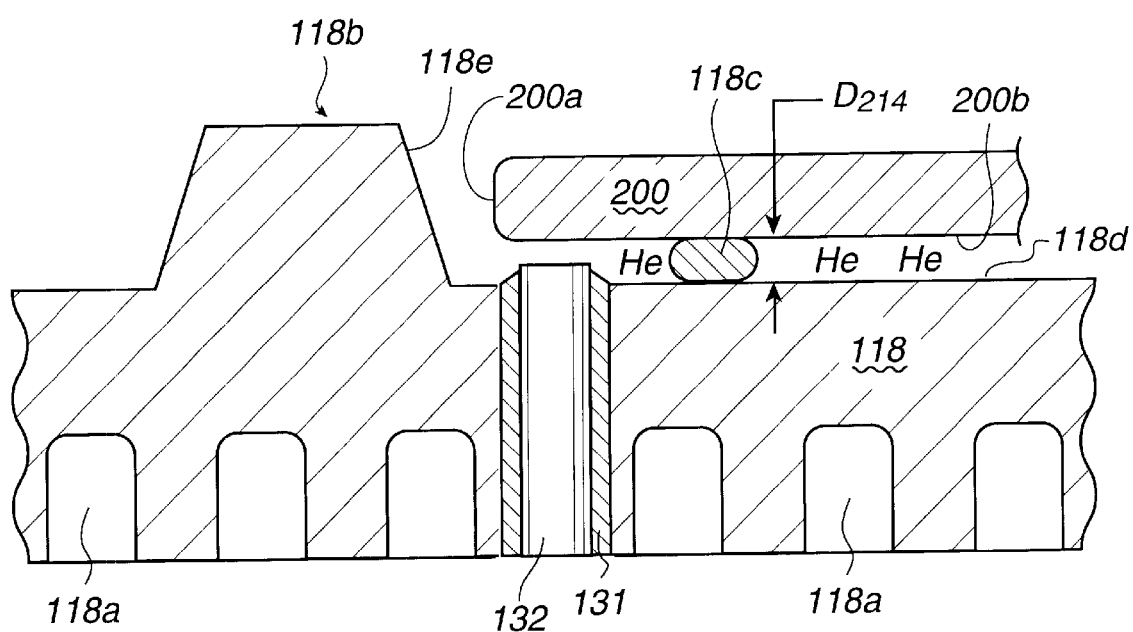
FIG. 8B shows the magnification of FIG. 8A in accordance with one embodiment of the present invention.

FIG. 8B shows the magnification 204 of FIG. 8A in accordance with one embodiment of the present invention. Gas that passes through the gas inlet 124b reside in between a surface 200b of the wafer 200 and the cooling surface 118d which is defined by a distance $D_{214}$ from the cooling surface 118d. The distance $D_{214}$ is preferably between about 4 mils to about 6 mils and more preferably about 5 mils. The lift pins 132 are held in place within the cooling bottom plate 118 by a seal 131. The seal 131 allows the lift pin 132 to move within the cooling bottom plate 118 while maintaining a vacuum. Thus, the vacuum formed within the chamber 121 will not be lost through the lift pins 132 or the seals 131.

It should be noted that the location of the seals 131 in the cooling plate 118 allow the use of improved seals 131 so a vacuum may be created or a vacuum bake operation performed if needed within the chamber 121. In the past, seals for lift pins were located in close proximity to a heating plate. As a result of the high temperatures sustained by the seals from the heating plate, this created problems with the seals ability to sustain a vacuum within the cure module. The present invention avoids this problem.

Figure 8C:
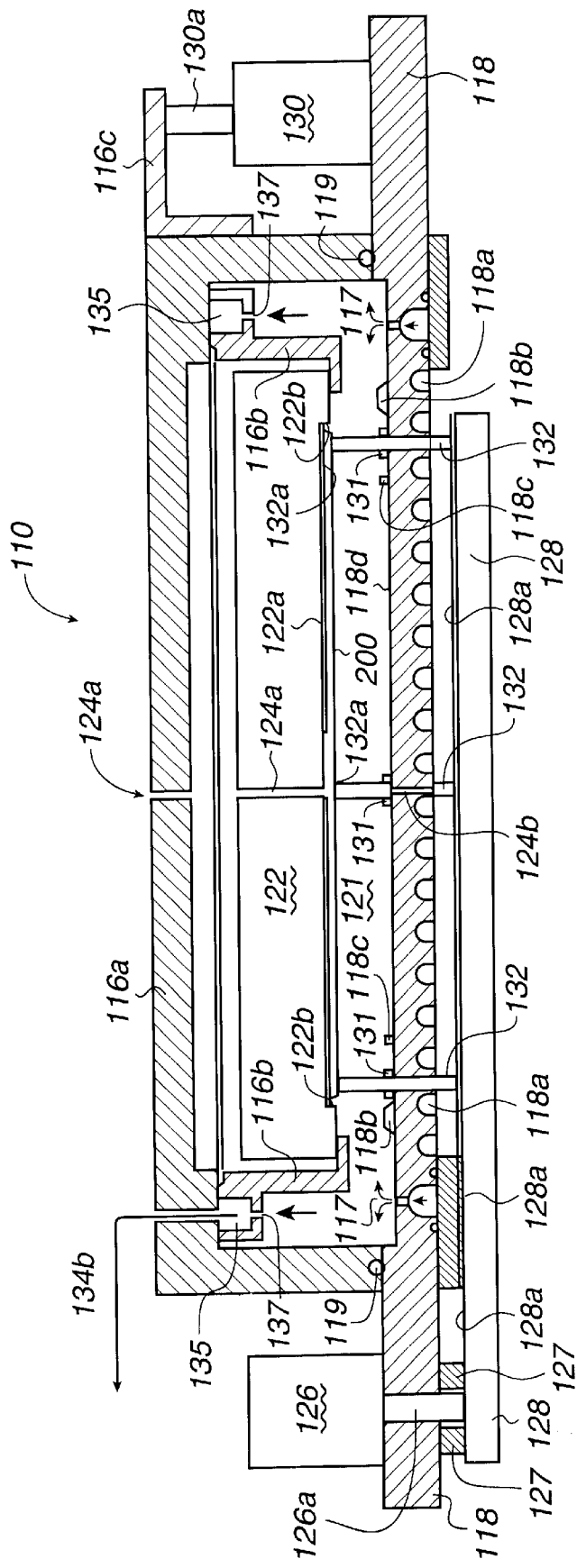
In FIG. 8C, an alternative embodiment of the present invention is shown.

In FIG. 8C, an alternative embodiment of the present invention is shown. A vacuum in the chamber 121 may be attained by having a vacuum port 134b in the housing 116a which extends into a channel 135 of the housing bracket 116b. The channel 135 is cut into the housing bracket 116b and extends around the hot plate 122 in the form of a ring. Holes 137 are also defined into the housing bracket 116b which connect into the channel 135 and extend around the hot plate 122. The air in the chamber 121 can be evacuated through the holes 137 into the channel 135 and then pumped out of the cure module 110 through the vacuum port 134b.

FIG. 8C also shows a push/pull environment which may be created within the cure module 110. Process gases can be "pushed" into the chamber 121 through process gas inlets 117. As gas is forced through the process gas inlets 117 into the chamber 121, it can be "pulled" out of the chamber 121 by vacuum port 134b. As such, process gases can be cycled through the chamber 121 to enhance the curing process of the wafer 200 in the cure module 110. It should be noted that the push/pull environment may also be created with the vacuum ports 134a.

Figure 9A:
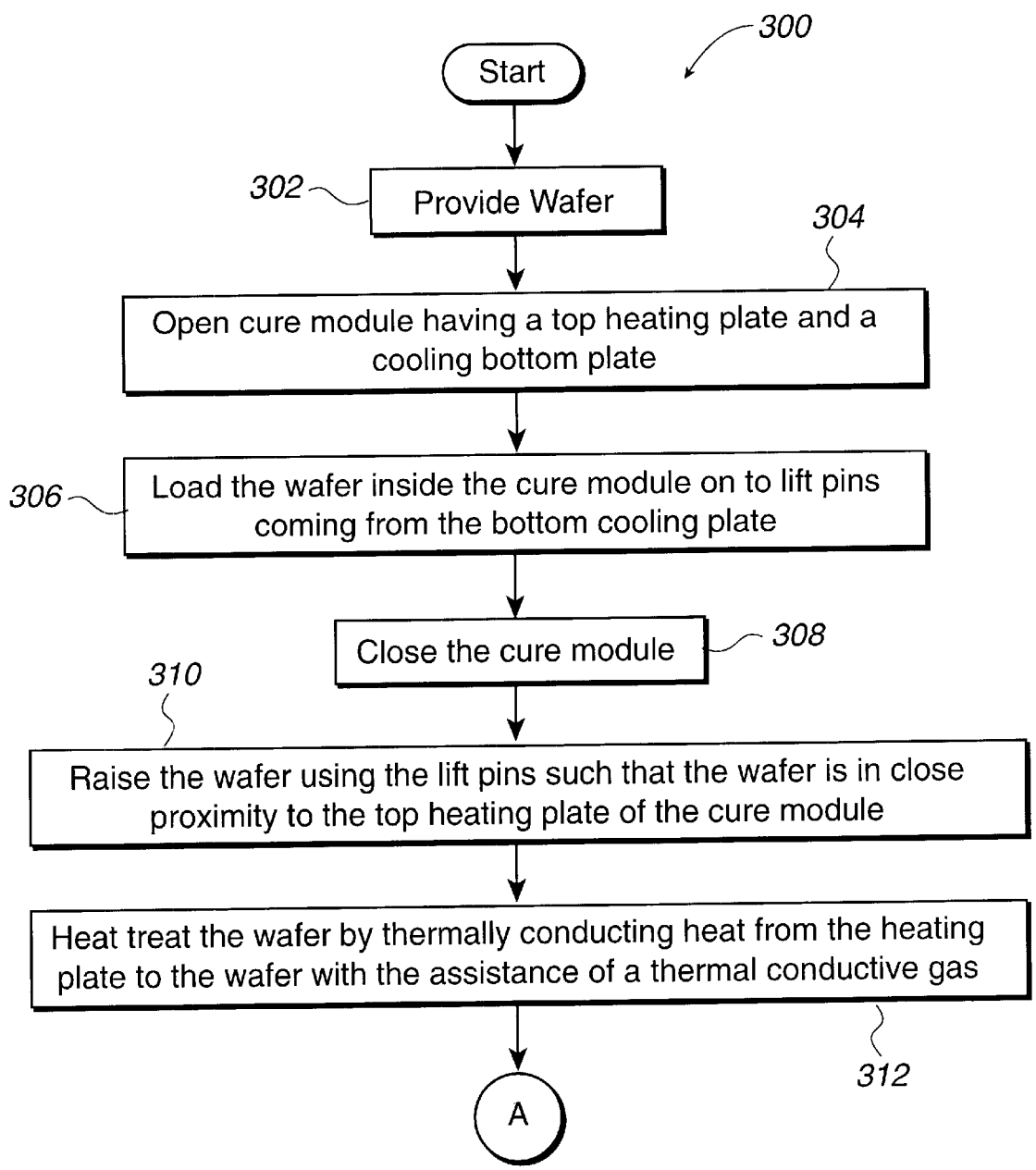
FIG. 9A is a flowchart for a curing operation using the cure module, in accordance with one embodiment of the current invention.

FIG. 9A is a flowchart for a curing operation within the cure module 110 in accordance with one embodiment of the current invention. In operation 302, a wafer is provided by an end effector 112a. In operation 304, the cure module 110 is open. The cure module 110 is defined by a heating plate 122 and a cooling bottom plate 118. The cure module 110 opens by separating the housing 116a from the cooling bottom plate 118. In one embodiment, the housing positioner 130 separates the housing 116a from the cooling bottom plate 118.

Once the cure module 110 is open, a wafer 200 is loaded inside the cure module 110 in operation 306. The wafer 200 is loaded into the cure module 110 and onto the lift pins 132 by placing the wafer 200 onto lift pin contact points 132a with the end effector 112a. The lift pins 132 extend through the cooling bottom plate 118. After the wafer 200 is loaded into the cure module 110, the cure module is closed in operation 308. The housing positioner 130 closes the cure module 110 by lowering the housing 116a onto the cooling bottom plate 118. The housing positioner 130 retracts the position extension 130a to lower the housing 116a onto the bottom cooling plate 118.

After the cure module 110 is closed, the wafer 200 is raised using the lift pins 132 in operation 310. Prior to moving the wafer 200 towards the heating plate 122, the wafer 200 may be aligned with the alignment pins 118b. In order to align the wafer 200 with the alignment pins 118b, the wafers is lowered towards the bottom cooling plate with the lift pins 132. Once the wafer is lowered to the bottom cooling plate 118, the alignment of the wafer 200 may be checked with the alignment pins 118b. After the alignment is checked, the lift pins 132 raise the wafer 200 such that the wafer 200 is in close proximity to the hotplate surface 122a of the heating plate 122. After the wafer 200 is positioned adjacent the hotplate surface 122a, a small space exists between the wafer 200 and the hotplate surface 122a such that the wafer 200 is not in direct contact with the hotplate surface 122a.

In operation 312, films formed on the wafer 200 are heat treated during a heat treating operation. The films of the wafer 200 are heat treated by thermally conducting heat from the heating plate 122 to the wafer 200. Heat from the heating plate 122 is conducted to the wafer 200 with the assistance of a thermal conductive gas. The thermal conductive gas is passed through the gas inlet 124a into the area between the hotplate surface 122a and the surface of the wafer 200. The presence of this gas from the gas inlet 124a increases the efficiency of the heating process.

Figure 9B:
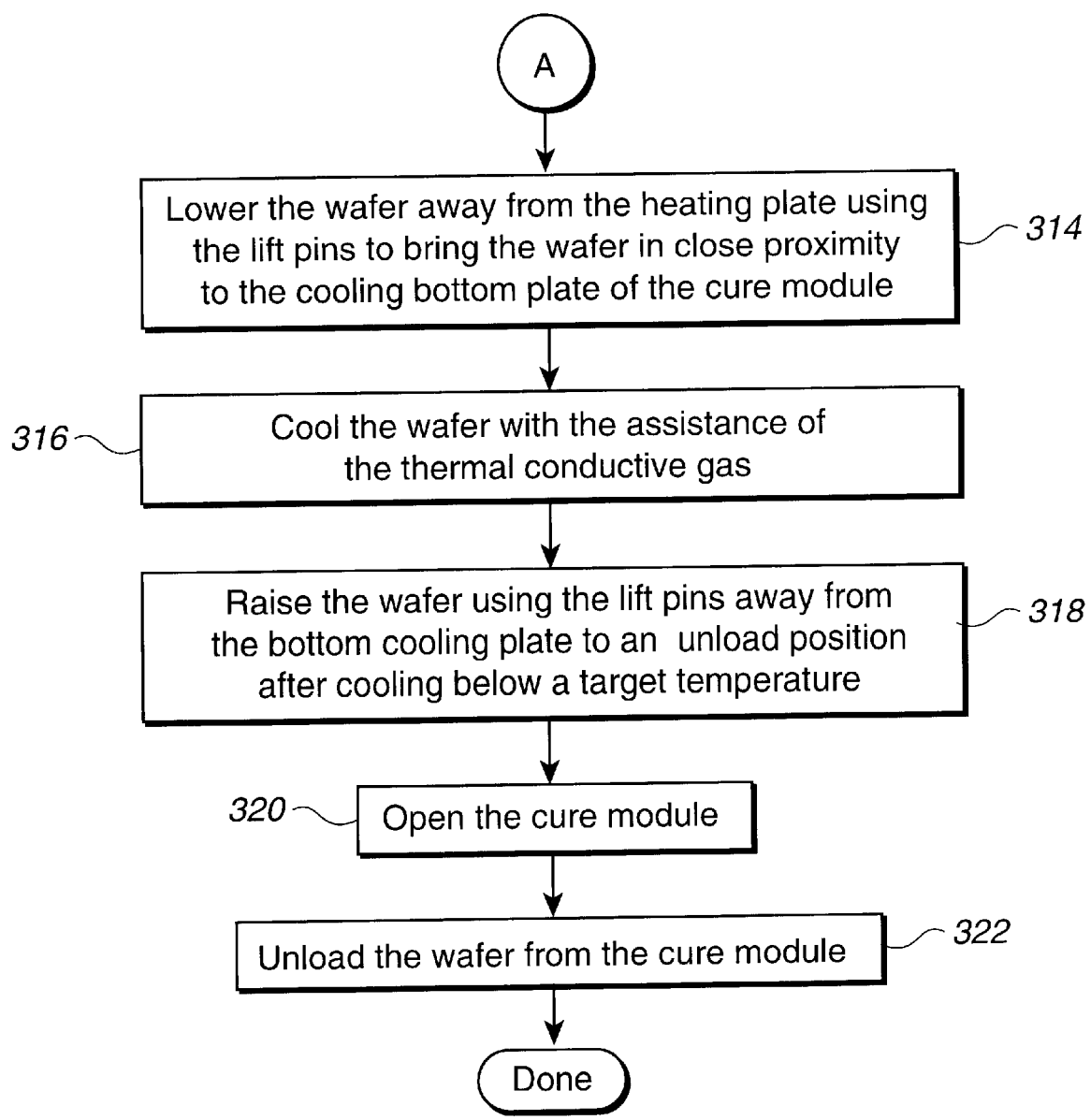
FIG. 9B is a continuation of the flowchart shown in FIG. 9A.

FIG. 9B is a continuation of the flowchart shown in FIG. 9A in accordance with one embodiment of the current invention. In operation 314, after the wafer 200 has been heat treated, the wafer is lowered away from the heating plate 122 using the lift pins 132. The lift pins 132 bring the wafer into close proximity to the cooling bottom plate 118 of the cure module 110. The lift pins 132 continue to lower the wafer 200 until the wafer 200 rests on standoffs 118c. After the wafer 200 comes into contact with the standoffs 118c, the lift pins 132 continue to move in a downward direction until the lift pins 132 are no longer contacting the wafer 200.

After the wafer 200 is lowered onto the standoffs 118c, a cooling operation 316 begins in the cure module 110. The wafer 200 is cooled with the assistance of a thermally conductive gas flowing through the gas inlet 124b. The gas flowing through the gas inlet 124b will flow into the chamber 121 of the cure module 110 such that it is between the cooling surface 118d of the cooling plate 118 and the surface 200b of the wafer 200. The cooling gas further accelerates the cooling process of the wafer 200 by transferring heat from the wafer 200 to the cooling bottom plate 118. Cooling of the wafer 200 in the cooling operation 316 occurs by passing cold air through the cooling fins 118a or by the use of cooling coils. As cool air passes through the cooling fins 118a, the cooling bottom plate 118 begins to cool. The lower temperature, which is preferably about 50° C., of the cool bottom plate 118 will cool the wafer 200, and the gas from the gas inlet 124b will further accelerate the cooling rate of the wafer 200.

After the cooling operation 318 is complete, the cure module 110 is opened in operation 320. The housing positioner 130 opens the cure module 110 by lifting the housing 116a away from the cooling bottom plate 118. After the cure module 110 is opened, the wafer 200 is unloaded from the cure module in operation 322. The wafer 200 is first lifted with the lift pins 132 away from the cooling bottom plate 118. After the wafer 200 is lifted away from the cooling bottom plate 118, the end effector 112a unloads the wafer 200 from the cure module 110, As shown in FIG. 9B, the curing of the wafer 200 is completed. After the cure process is done, the silicon wafer is now ready for photolithography. As is well known, during photolithography, the film of the silicon wafer 200 may be configured for metallization lines. For example, a photoresist mask may be patterned for copper (Cu) metallization lines. The copper metallization lines may be formed in the silicon wafer film 200 using a damascene process. Alternatively, the cured dielectric layer may be ready for metal deposition and then metal patterning.

The present invention now allows users to cure films on silicon wafers in a shorter amount of time with greater thermal uniformity throughout the film on the wafer. The configuration of the heating plate and the cooling plate allows for more efficient heating and cooling of films over silicon wafers during a cure operation. In addition, the housing and cantilever positioners minimize thermal losses of the cure module, thereby increasing the overall efficiency of the cure module. Also, the use of helium gas increases the heat exchange rate from the heating plate and the bottom cooling plate to the film on the wafer. Furthermore, the cooling fins and the cooling coils decrease the cooling time and increase efficiency.

The present invention is configured such that the heating plate is located above the cooling plate. This configuration avoids the prior art problem of rising heat warming a cooling plate located above the heating plate during a heating operation. In prior art configurations, the cooling plate was located above the heating plate, therefore, during a heating operation, heat would rise and warm the cooling plate. As a result, when a cooling liquid passed through the cooling plate, the temperature of coolant was increased before it reached the wafer. Consequently, the cooling time in prior art configurations for films on a wafer increased. The present invention avoids this problem by having the heating plate located above the cooling plate. Heat from the hot plate does not rise and warm the cooling plate. Therefore, the cooling rate in the present cure module increases since the cooling plate is maintained at a cooler temperature during the heating process. Thus, increasing the curing efficiency and decreasing the curing time within the cure module.

The housing and cantilever positioners increase the thermal efficiency of the present cure module. The present invention avoids the use of a door mechanism to allow access into the cure module chamber. Consequently, the sealing problems inherent with a door mechanism are not existent in the present invention. Instead, the housing positioner raises and lowers the housing onto the bottom cooling plate. As the housing is lowered onto the cooling bottom plate, it engages the bottom cooling plate with an O-ring. As a result, there are no seals present which allow for thermal leakage in the cure module, thereby increasing the overall thermal efficiency of the present cure module.

The use of gas during heating and cooling operations assures heating uniformity and increases the curing efficiency within the present cure module. The gas spreads uniformly over the film of a wafer compensating for any non-uniform gaps that may arise between the hot plate and the wafer. Hence, the gas ensures uniform heating of the wafer during a heating operation. Also, the presence of the gas between the hot plate and the wafer increases the convection rate of heat from the hot plate to the wafer and the convection rate of cooling air from the cooling bottom plate to the wafer. Thus, the heating and cooling efficiency of the present cure module is greatly increased.

The bottom cooling plate is cooled with cooling fins or cooling coils. Since the cooling fins and cooling coils can be directly water cooled or air cooled, the time to bring films and wafers to a cooler temperature is greatly reduced, again increasing the cooling efficiency and the overall efficiency of the present invention.

The location of the lift pins and the wafer standoffs of the present cure module also allow for uniform heating throughout films on silicon wafers. The lift pins used to raise and lower silicon wafers pass through the cooling plate and the standoffs rest on the cooling plate. Thus, during a heating operation, they do not introduce thermal discontinuities on the film of the wafer. Instead, the film on a wafer is uniformly heated during the heating operation, thus avoiding the deleterious effects of thermal discontinuities associated with the prior art. Furthermore, the seals which contain the lift pins are also located in the bottom cooling plate, as opposed to the hot plate as in the prior art. Thus, the seal will not degrade due to high heat over the lifetime of the cure module and allow the seepage of oxygen ($O_2$) into the cure module and thermal leakage from the cure module.

The location of the lift pins also solves the problems of thermal discontinuities by not having through holes in the heating plate which allow for passage of the lift pins. As previously discussed, there are no longer voids in the heating plate to allow passage of the lift pins which create thermal discontinuities. Consequently, the heating is more uniform.

The lift pin contact points on the wafer and the standoff contact points with the wafer minimize the problems associated with of backside particulates deposited on the wafer. The lift pins and the standoffs contact the wafer at the outer periphery of the back of the wafer. Therefore, contact is minimized with the center of the wafer. As is well known, the center of the wafer is the location where the highest yield of good die is attained. Backside particulates in the center of a die limit the yield during photolithography techniques. The presence of backside particles in the center of the wafer will cause misalignment of the wafer with the stepper as it is clamped down on chucks. The misalignment will cause images at the center to come out of alignment, which reduces the overall yield of good die. The present invention minimizes this problem since the lift pins and the standoffs are in contact with the wafer at the edges of the bottom surface of the wafer.

The present cure module also contains a recess lip which facilitates uniform heating of the film on a silicon wafer. The wafer sits in the recess lip in the hot plate which allows for even heating of the wafer during a heat operation. This avoids the problems of thermal discontinuities, which may have detrimental effects on the performance of semiconductor devices using the wafer.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A curing module for use in fabricating semiconductor wafers, comprising:
    a bottom plate including a cooling structure;
    a chamber being defined by the bottom plate and a housing, the housing having a top surface and sidewalls, and the sidewalls being configured to engage with the bottom plate;
    a heating plate positioned within the chamber and adjacent to the top surface of the housing, a wafer capable of being positioned within the chamber, such that the heating plate is above the wafer and the bottom plate is below the wafer;
    a sidewall extension extending from the sidewall of the housing; and
    a housing positioner having one end adjacent the sidewall extension, the housing positioner being capable of raising the sidewall extension such that when the sidewall extension is raised, the housing will raise with the sidewall extension; the housing positioner being capable of lowering the sidewall extension such that when the sidewall extension is lowered, the housing will lower with the sidewall extension.

2. A curing module for use in fabricating semiconductor wafers as recited in claim 1, wherein the cooling structure maintains the bottom plate at a reduced temperature.

3. A curing module for use in fabricating semiconductor wafers as recited in claim 1, wherein a region is defined within the chamber which is bounded by the sidewalls of the housing, a hotplate surface of the heating plate, and the bottom plate.

4. A curing module for use in fabricating semiconductor wafers as recited in claim 3, further comprising:
    at least three lift pins being defined through the bottom plate and extending into the region.

5. A curing module for use in fabricating semiconductor wafers as recited in claim 4, wherein the at least three lift pins are configured to move the wafer between the bottom plate and the hotplate surface within the region.

6. A curing module for use in fabricating semiconductor wafers as recited in claim 5, wherein the heating plate has a surface that is adjacent to the top surface of the housing and the hotplate surface is opposite the surface.

7. A curing module for use in fabricating semiconductor wafers as recited in claim 6, wherein the hotplate surface of the heating plate contains a recess, the wafer being configured to at least partially fit within the recess.

8. A curing module for use in fabricating semiconductor wafers as recited in claim 3, wherein the bottom plate has a top surface that engages with the sidewalls of the housing.

9. A curing module for use in fabricating semiconductor wafers as recited in claim 8, further comprising:
    an O-ring being defined between an engaging surface of the sidewalls and the top surface of the bottom plate, the O-ring being configured to facilitate vacuum conditions within the region.

10. A curing module for use in fabricating semiconductor wafers as recited in claim 8, further comprising:
    alignment pins located on the top surface of the bottom plate, the alignment pins being configured to facilitate alignment of the wafers with respect to the heating plate and the bottom plate.

11. A curing module for use in fabricating semiconductor wafers as recited in claim 1, wherein the curing module is configured to be stacked upon a second curing module.

12. A curing module for use in fabricating semiconductor wafers as recited in claim 5, further comprising:
    a cantilever positioner attached to a bottom surface of the at least three lift pins, the cantilever positioner facilitating movement of the at least three lift pins through the bottom plate.

13. A curing module for use in fabricating semiconductor wafers as recited in claim 12, wherein the cantilever positioner facilitates movement of the wafer through the region.

14. A curing module for use in fabricating semiconductor wafers as recited in claim 1, wherein the cure module cures films formed over silicon wafers.

15. A module for curing films on a semiconductor wafer, comprising:

a bottom plate having cooling fins;

a heating plate located above the bottom plate, a wafer capable of being positioned in a region between the bottom plate and the heating plate, wherein the heating plate heats a film on the wafer and the bottom plate cools the film;

a housing which sealingly engages the bottom plate in order to facilitate the formation of a vacuum;

a top surface of the housing containing the heating plate such that a chamber is formed which is bounded by the heating plate, sidewalls of the housing and the bottom plate, at least three lift pins which go through the bottom plate and are configured to hold a wafer, the at least three lift pins moving a wafer in the region between the bottom plate and the heating plate; and a housing positioner engaged with an extension from the sidewall of the housing, the housing positioner raising and lowering the housing from the bottom plate.

16. An apparatus for curing wafers, comprising:

a cooling bottom plate having cooling fins located on the cooling bottom plate whereby the cooling fins cool the bottom plate such that the bottom cooling plate cools a wafer during a curing operation;

a housing which sealingly engages with the cooling bottom plate;

a heating plate located inside the housing such that the heating plate is above the cooling bottom plate, whereby the heating plate heats the wafer during the curing operation, the wafer being positioned between the cooling bottom plate and the heating plate;

at least three lift pins in the cooling bottom plate which raise the wafer to the heating plate and lower the wafer to the cooling bottom plate; and a cantilever positioner which lowers and raises the at least three lift pins.

17. An apparatus for curing wafers according to claim 16, further comprising:

an O-ring that sealingly engages the housing to the bottom cooling plate such that a vacuum may be formed within the cure module.

18. An apparatus for curing wafers according to claim 16, wherein the heating plate contains a recess whereby the wafer may fit into the recess such that a top surface of the wafer and a side surface of the wafer fit within the recess and the heating plate.

19. An apparatus for curing wafers according to claim 16, further comprising at least three alignment pins in the cooling bottom plate which align the wafer with the heating plate and align the wafer with the bottom cooling plate.

20. An apparatus for curing wafers according to claim 16, wherein the apparatus is stackable, whereby a first apparatus for curing wafers is stackable upon a second apparatus for curing wafers.

21. An apparatus for curing wafers according to claim 17, further comprising a housing positioner which raises the housing from the bottom cooling plate and lowers the housing onto the bottom cooling plate.

22. An apparatus for curing wafers according to claim 16, wherein the apparatus cures films disposed on wafers.

23. An apparatus for curing wafers, comprising:

a cooling bottom plate having cooling fins located on the cooling bottom plate whereby the cooling fins cool the bottom plate such that the bottom cooling plate cools a wafer during a curing operation;

a housing which sealingly engages with the cooling bottom plate;

a heating plate located inside the housing such that the heating plate is above the cooling bottom plate, whereby the heating plate heats the wafer during the curing operation;

at least three lift pins in the cooling bottom plate which raise the wafer to the heating plate and lower the wafer to the cooling bottom plate; and a cantilever positioner which lowers and raises the at least three lift pins;

wherein the apparatus is stackable, whereby a first apparatus for curing wafers is stackable upon a second apparatus for curing wafers.

24. A curing module for use in fabricating semiconductor wafers, comprising:

a chamber including a bottom plate and a housing, the housing having a top surface and sidewalls, and the sidewalls being configured to engage with the bottom plate to define the chamber;

a heating plate defined within the chamber and adjacent to the top surface of the housing;

at least three lift pins in the bottom plate which raise a wafer to the heating plate and lower the wafer to the bottom plate; and a cantilever positioner which lowers and raises the at least three lift pins;

wherein the curing module is configured to be stacked upon a second curing module.

* * * * *